United States Patent
Ku et al.

(10) Patent No.: US 6,329,276 B1
(45) Date of Patent: Dec. 11, 2001

(54) METHOD OF FORMING SELF-ALIGNED SILICIDE IN SEMICONDUCTOR DEVICE

(75) Inventors: Ja-Hum Ku, Songnam; Soo-Geun Lee, Yongin; Chul-Sung Kim, Anyang; Tae-Wook Seo, Suwon; Eung-Joon Lee, Seoul; Joo-Hyuk Chung, Suwon, all of (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/392,470

(22) Filed: Sep. 9, 1999

(30) Foreign Application Priority Data

Dec. 1, 1998 (KR) .................................................. 98-52238

(51) Int. Cl.$^7$ ............................................... H01L 21/3205
(52) U.S. Cl. ........................... 438/586; 438/592; 438/595; 438/660; 438/669; 438/682; 438/683; 438/655
(58) Field of Search ..................................... 438/586, 592, 438/595, 682, 683, 660, 669, 655

(56) References Cited

U.S. PATENT DOCUMENTS

| 5,902,129 | * | 5/1999 | Yoshikawa et al. | ................. 438/592 |
|---|---|---|---|---|
| 6,040,606 | * | 3/2000 | Blair | ..................................... 257/384 |
| 6,060,387 | * | 5/2000 | Shepela et al. | ....................... 438/630 |
| 6,136,705 | * | 10/2000 | Blair | ..................................... 438/682 |
| 6,153,485 | * | 11/2000 | Pey et al. | ............................. 438/305 |

* cited by examiner

*Primary Examiner*—John F. Niebling
*Assistant Examiner*—Lynne Gurley
(74) *Attorney, Agent, or Firm*—Cantor Colburn LLP

(57) ABSTRACT

There is provided a semiconductor device fabrication method. In the method, a gate layer is formed on a semiconductor substrate and patterned to form a first resultant structure, a metal layer is formed on the first resultant structure, a capping layer is formed on the metal layer, a metal silicide is formed on the gate layer by heating the substrate at a first temperature, unreacted metal layer and first capping layer are removed to form a second resultant structure, a second capping layer is formed on the second resultant structure, and the substrate is heated at a second temperature higher than the first temperature. The second capping layer suppresses a silicidation rate in the secondary heat treatment, thereby allowing a silicide of a good morphology to be achieved.

13 Claims, 9 Drawing Sheets

US 6,329,276 B1

METHOD OF FORMING SELF-ALIGNED SILICIDE IN SEMICONDUCTOR DEVICE

TECHNICAL FIELD OF THE INVENTION

The present invention relates to a semiconductor device fabrication method, and in particular, to a method of forming a self-aligned silicide region in a semiconductor device.

BACKGROUND OF THE INVENTION

Along with high integration, high performance, and low power consumption in semiconductor devices, a low-resistance gate material is required to reduce a gate length in transistors and memory cells through formation of fine patterns and to improve device characteristics. The thickness of a gate insulation layer gradually decreases to increase a channel current in a transistor and a memory cell due to low power consumption. In order to prevent short channel effects caused by the reduction of the gate length in a transistor and secure a margin against punchthrough, the sacrificial resistance, for example, sheet resistance and contact resistance of a source/drain region, should be reduced while a source/drain junction is formed to be shallow.

Therefore, research has been conducted on a salicide (self-aligned silicide) process in which a silicide is formed on the surfaces of a gate and a source/drain region to thereby reduce the resistivity of the gate and the sheet resistance and contact resistance of the source/drain region. The salicide process indicates selective formation of a silicide region only on a gate and a source/drain region.

The silicide region is formed of titanium silicide ($TiSi_2$) or materials of the group-VIII suicides (e.g., $PtSi_2$, $PdSi_2$, $CoSi_2$, and $NiSi_2$).

Meanwhile, a capacitor is formed after a salicide process in an MDL (Merged DRAM Logic) device having a memory device and a logic device on the same chip. Heat treatment for forming the capacitor results in agglomeration of silicide, increasing the contact resistance and sheet resistance of a source/drain region and degrading junction leakage characteristics due to diffusion of metal atoms.

Accordingly, titanium silicide and cobalt silicide are widely used due to their high temperature stability and low resistivity. Of the two the latter is more popular than the former because it is less dependent on the critical dimension of a gate in a semiconductor devices having a 0.25 $\mu m$ design rule. Cobalt silicide offers the benefits of low resistivity (16–18 $\mu\Omega cm$) and high temperature stability (at about 900° C.).

A cobalt salicide process has a distinctive shortcoming in that silicide overgrows on a gate sidewall spacer used to form a silicide region in self-alignment or cobalt is oxidized. In order to prevent oxidization of cobalt and achieve a good quality silicide, there is disclosed in U.S. Pat. No. 5,567,651 a method of forming a capping layer by depositing a conductor such as titanium nitride (TiN) or titanium tungsten (TiW) on a cobalt layer.

FIG. 1 is a flowchart of a cobalt salicide process described in the above U.S. patent. Referring to FIG. 1, a cobalt layer is deposited after wet cleaning for removing a native oxide layer on silicon and polysilicon surfaces. Then, a capping layer is formed by depositing, for example, titanium nitride on the cobalt layer in-situ. Cobalt monosilicide (CoSi) is formed by a primary heat treatment and then unreacted cobalt and titanium nitride layers are removed by wet etching. Subsequently, the cobalt monosilicide is phase-transited to cobalt disilicide ($CoSi_2$) having low resistivity by a secondary heat treatment.

FIGS. 2 and 3 are sectional views sequentially illustrating a MOS (Meta-Oxide-Semiconductor) transistor fabrication method to which the conventional salicide process is applied. Referring to FIG. 2, a field region and an active region are defined on a silicon substrate 10 by forming a field oxide film 12 on the substrate 10 by a general device isolation technique. After a gate insulation layer 14 and a polysilicon gate layer 16 for a transistor are sequentially formed on the active region, sidewall spacers 18 are formed at edges of the polysilicon gate layer 16 by depositing an insulation layer on the resultant structure and anisotropically etching the insulation layer. Subsequently, a source/drain region 20 is formed by ion implanting an N-type impurity for an N-channel transistor and a P-type impurity for a P-channel transistor. After cobalt 22 is deposited on the resultant structure by sputtering, a capping layer 24 is formed by in-situ depositing titanium nitride on the cobalt layer 22 by sputtering.

Referring to FIG. 3, the substrate 10 is subject to a primary heat treatment at 400–600° C. in a general rapid thermal annealer, causing a silicide reaction where cobalt is in contact with silicon. Thus, cobalt monosilicide regions 26 and 28 are formed on the source/drain region 20 and the polysilicon gate layer 16, without silicide on the field region and the sidewall spacers 8. Subsequently, unreacted cobalt and capping layers are selectively removed by wet etching using an etchant which does not attack the cobalt monosilicide regions 26 and 28, the silicon substrate 10, and the gate insulation layer 14. Then, the cobalt monosilicide regions 26 and 28 are phase-transited to cobalt disilicide having low resistivity by a secondary heat treatment at 700–900° C. in the general rapid thermal annealer.

In the conventional method as described above, stresses are concentrated due to a rapid silicide reaction by the second heat treatment at high temperature or the morphology of the cobalt disilicide regions is poor as shown in an SEM (Scanning Electron Microscope) picture of FIG. 4, thereby producing a rough silicide-silicon interface. In addition, the silicide reaction entails diffusion of cobalt and silicon. The cobalt diffusion in the secondary heat treatment causes silicide spiking even in the vicinity of a depletion layer of a source/drain junction, increasing a junction leakage current.

SUMMARY OF THE INVENTION

An object of the present invention is to provide a semiconductor device fabrication method for forming a silicide exhibiting a good morphology. To achieve this object, there is provided a semiconductor device fabrication method. In the method, a gate layer is formed on a semiconductor substrate and patterned to form a first resultant structure. A metal layer is formed on the first resultant structure, and a first capping layer is formed on the metal layer. A metal silicide is formed on the gate layer by heating the substrate at a first temperature, and an unreacted metal layer and the first capping layer are removed to form a second resultant structure. A second capping layer is formed on the second resultant structure, and the substrate is heated at a second temperature higher than the first temperature.

In accordance with the present invention, the metal layer is preferably formed of cobalt and sidewall spacers are formed at both edges of the gate layer prior to the metal layer being formed.

Preferably, the forming of the source/drain regions at both sides of the gate layer on the substrate is further provided before forming the metal layer. In addition, the metal silicide is formed on the surfaces of the source/drain regions.

The second capping layer is preferably formed of a conductor selected from titanium nitride, titanium tungsten, tantalum nitride, and tungsten nitride. If the second capping layer is formed of a conductor, removing the second capping layer is further provided after heating the substrate at the second temperature. Preferably, the second capping layer is formed of an insulator selected from an oxide, SiN, and SiON. Furthermore, the second capping layer is preferably formed to be 10 Å or thicker.

Preferably, a metal monosilicide is formed on the gate layer in heating the substrate at the first temperature, and the metal monosilicide is changed to a metal disilicide in heating the substrate at the second temperature.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE PREFERRED EMBODIMENTS

Preferred embodiments of the present invention will be described with reference to the attached drawings.

Figure 1:
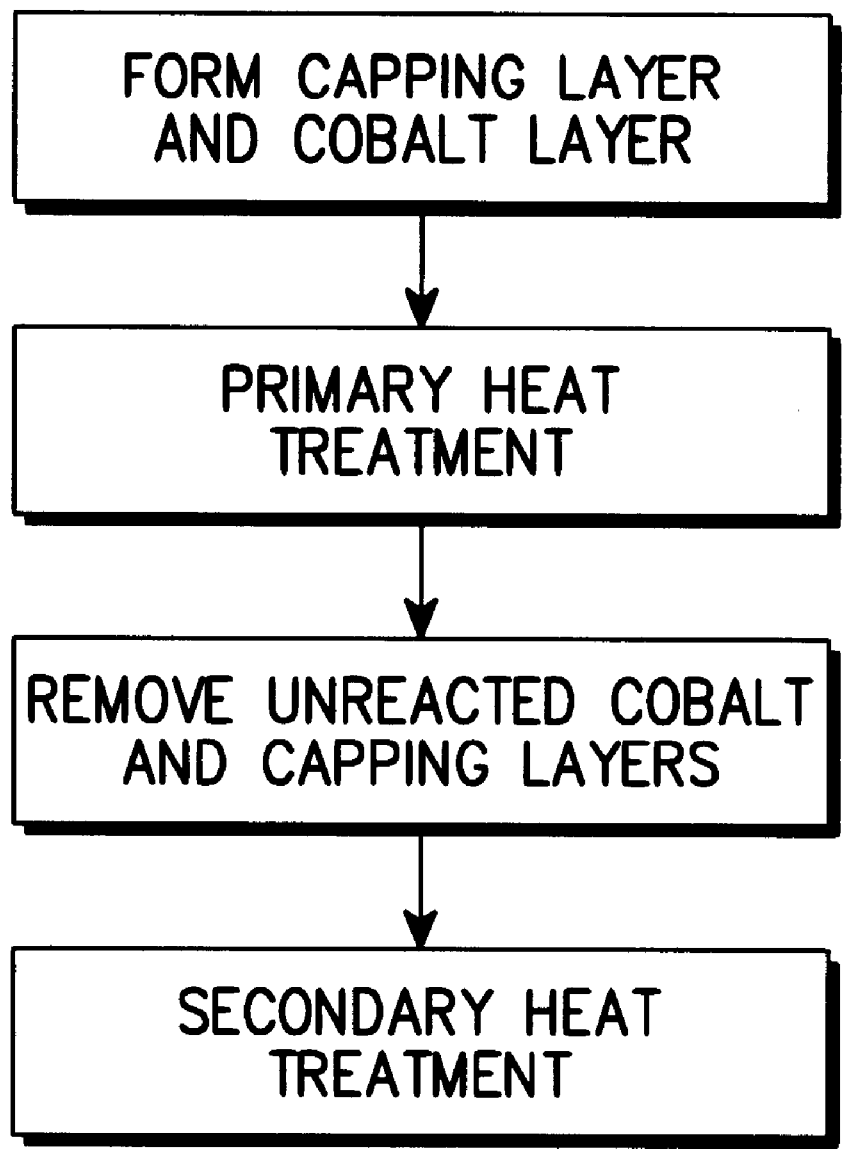
FIG. 1 is a flowchart of a conventional cobalt salicide process of the prior art.
Figure 2:
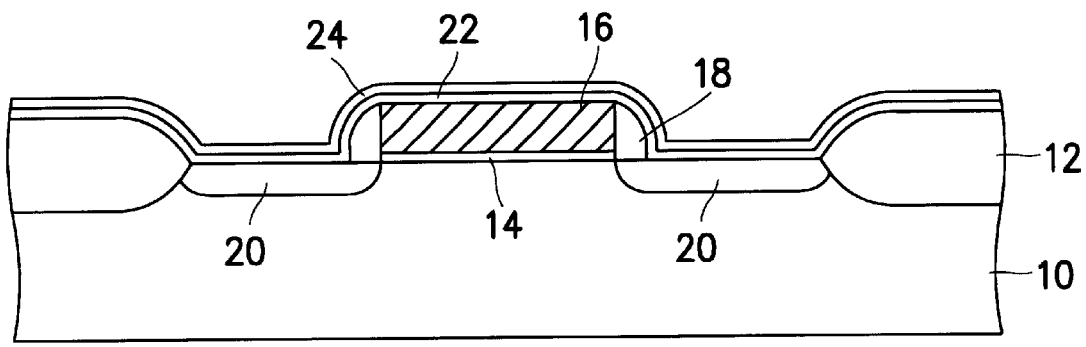
FIGS. 2 and 3 are sectional views sequentially illustrating a MOS transistor fabrication method to which the cobalt salicide process shown in FIG. 1 is applied.
Figure 3:
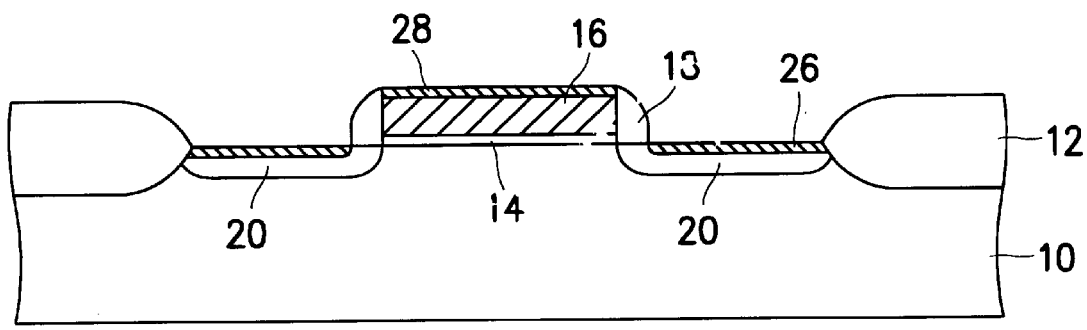
Figure 4:
FIG. 4 is an SEM picture showing the morphology of a cobalt silicide formed in the conventional method.
Figure 5:
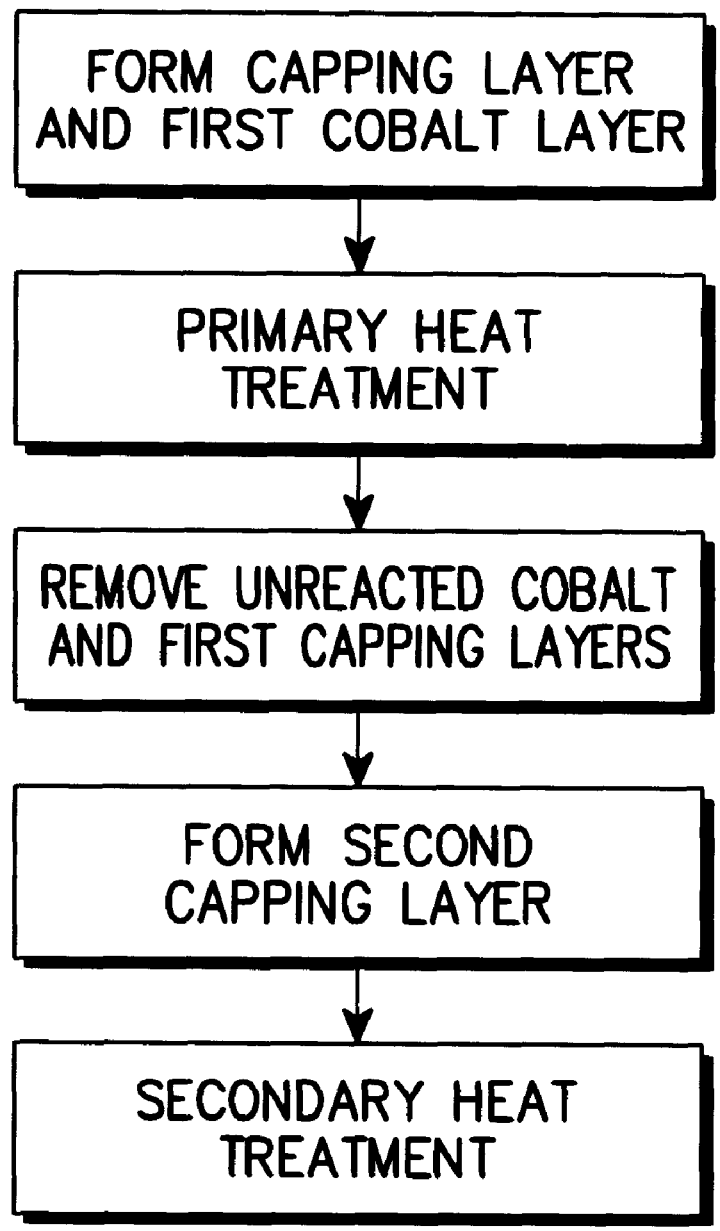
FIG. 5 is a flowchart of a cobalt salicide process according to the present invention.

FIG. 5 is a flowchart of a cobalt salicide process according to the present invention. Referring to FIG. 5, a cobalt layer is deposited after a substrate is wet cleaned with use of a chemical such as hydrogen fluoride (HF) to remove a native oxide layer on silicon and polysilicon surfaces. Then, a first capping layer is formed by in-situ depositing titanium nitride, titanium tungsten, tantalum nitride, or tungsten nitride on the cobalt layer. The first capping layer functions to prevent oxidation of cobalt and overgrowth of cobalt silicide into an unintended area.

Thereafter, a cobalt monosilicide layer is formed by a primary heat treatment at a first temperature, for instance, 400–600° C. and then unreacted cobalt and first capping layers are removed by wet etching.

A second capping layer is formed of a conductor selected from titanium nitride, titanium tungsten, tantalum nitride, and tungsten nitride, or an insulator selected from an oxide, SiN, and SiON on the resultant structure to be 10 Å or thicker. The second capping layer acts to suppress cobalt diffusion and control a silicidation rate in a secondary heat treatment.

Subsequently, the cobalt monosilicide is phase-transited to cobalt disilicide having low resistivity by subjecting the substrate to the secondary heat treatment at a second temperature higher than the first temperature, for instance, at 700–900° C. The remaining second capping layer is removed by wet etching if the second capping layer is formed of a conductor.

FIGS. 6 to 10 are sectional views sequentially illustrating a MOS transistor fabrication method to which a cobalt salicide process is applied according to a first embodiment of the present invention.

Figure 6:
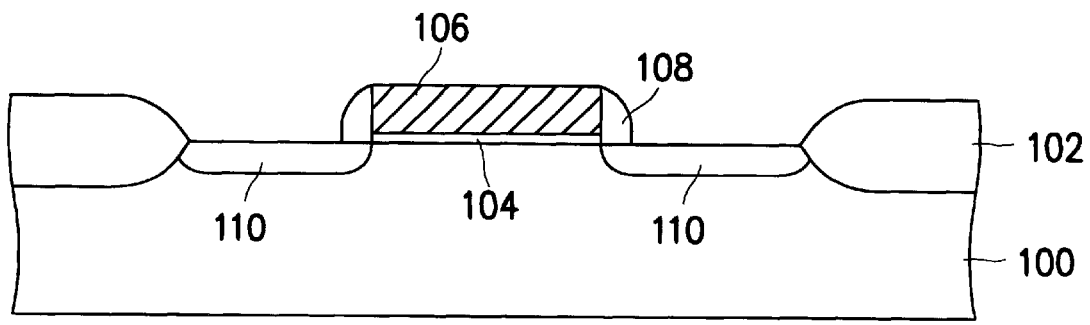
FIGS. 6 to 10 are sectional views sequentially illustrating a MOS transistor fabrication method to which a cobalt salicide process according to a first embodiment of the present invention 1 is applied.

FIG. 6 illustrates the forming of a transistor. A field region and an active region are defined on a silicon substrate 100 by forming a field oxide film 102 on the substrate 100 in a general device isolation technique. Then, a gate insulation layer 104 is formed on the active region by thermal oxidation, and a gate layer 106 is formed by depositing polysilicon on the gate insulation layer 104 by LPCVD (Low Pressure Chemical Vapor Deposition) and patterning the polysilicon by photolithography. Sidewall spacers 108 are formed at the edges of the gate layer 106 by depositing an insulation layer on the resultant structure and etching back the insulation layer anisotropically, for instance, by RIE (Reactive Ion Etching). Preferably, the sidewall spacers 108 are formed of a material like a nitride or oxide, which withstands silicidation.

Subsequently, a source/drain region 110 at high concentration is formed on the substrate 100 by ion implanting an N-type impurity in the case of an N-channel transistor with the sidewall spacers 108 and the gate layer 106 used as an ion implantation mask.

Figure 7:
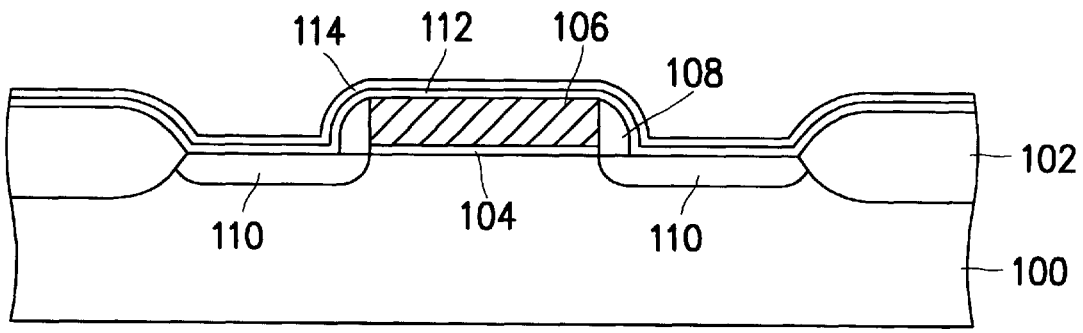

FIG. 7 illustrates forming a cobalt layer 112 and a first capping layer 114. Cobalt 112 as a silicide forming material is deposited to a thickness of about 100–300 Å on the resultant structure having the transistor formed thereon by sputtering. Then, the first capping layer 114 is formed by in-situ depositing titanium nitride on the cobalt layer 112 to a thickness of about 100 Å by sputtering. Titanium tungsten, tantalum nitride, or tungsten nitride may be a candidate material for the first capping layer.

Figure 8:
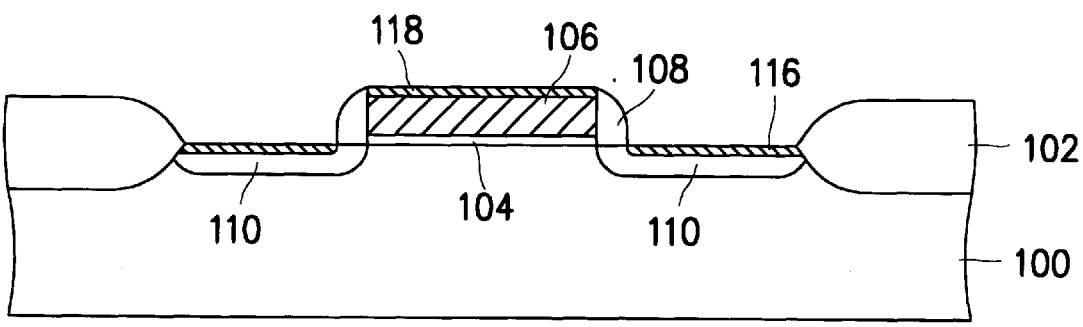

FIG. 8 illustrates one exemplary primary heat treatment. The substrate 100 having the first capping layer 114 formed thereon is loaded into a reaction chamber in a general rapid thermal annealer and heated in a nitrogen ($N_2$) atmosphere at 400–600° C. for 10–120 seconds, so that a silicidation takes place where cobalt is in contact with silicon. As a result, cobalt monosilicide regions 116 and 118 are formed on the source/drain region 110 and the polysilicon gate 106.

Then, unreacted cobalt and first capping layers are removed by wet etching with an etchant which does not attack the cobalt monosilicide regions 116 and 118, the silicon substrate 100, and the gate insulation layer 104.

Figure 9:
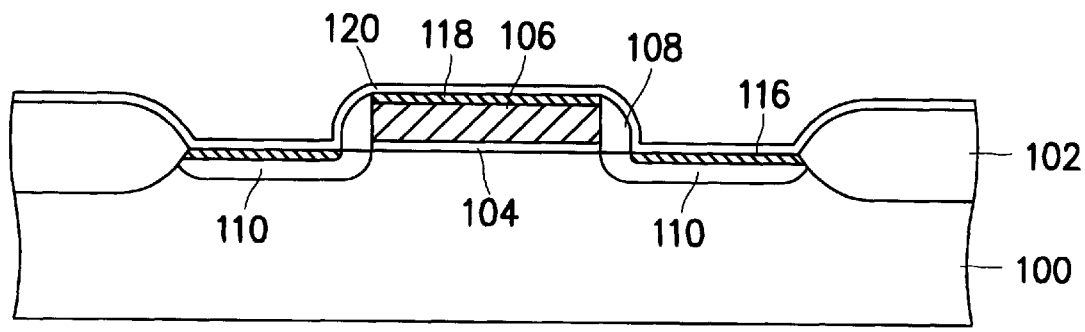

FIG. 9 illustrates the forming of a second capping layer 120 by depositing a conductor, preferably, titanium nitride on the resultant structure to be 10 Å or thicker by sputtering. The second capping layer 120 may be formed of titanium tungsten, tantalum nitride, or tungsten nitride. Here, the second capping layer 120 serves to control a silicidation rate in a subsequent secondary heat treatment.

Figure 10:
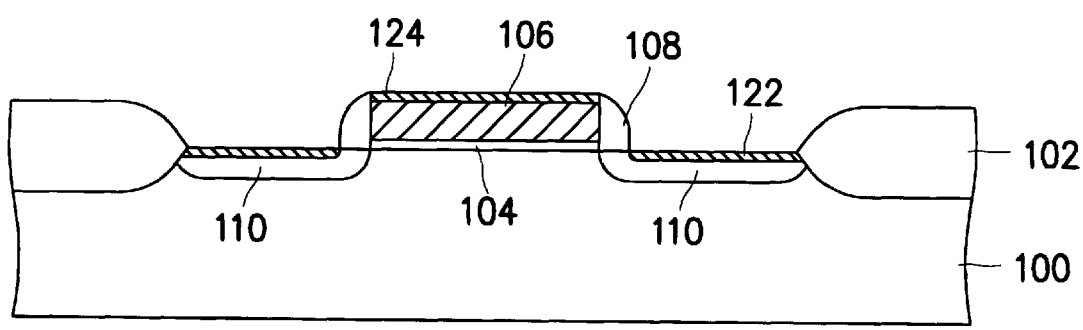

FIG. 10 illustrates an exemplary secondary heat treatment. The substrate 100 having the second capping layer 120 formed thereon is loaded into the reaction chamber in the general rapid thermal annealer and heated in a nitrogen atmosphere at 700–900° C. for 10–120 seconds. As a result, cobalt monosilicide reacts with silicon, thereby phase-transiting the cobalt monosilicide regions 116 and 118 to cobalt disilicide regions 122 and 124 having low resistivity. For example, if the cobalt layer is 100 Å thick, an about 200 Å thick cobalt monosilicide layer is formed in the primary heat treatment and then an about 400 Å thick cobalt disilicide layer is formed in the secondary heat treatment.

Subsequently, the remaining second capping layer 120 is selectively removed by wet etching using an etchant such as sulphuric acid, which does not attack the cobalt disilicide regions 122 and 124, the silicon substrate 100, and the gate insulation layer 104.

Figure 11:
FIG. 11 is an SEM picture showing the morphology of a cobalt silicide formed according to the first embodiment of the present invention.

FIG. 11 is an SEM picture showing the morphology of the cobalt disilicide formed according to the first embodiment of the present invention. It is noted from the drawing that the morphology of the cobalt disilicide is good since the second capping layer deposited on the cobalt monosilicide suppresses a silicidation rate in the secondary heat treatment.

Figure 12:
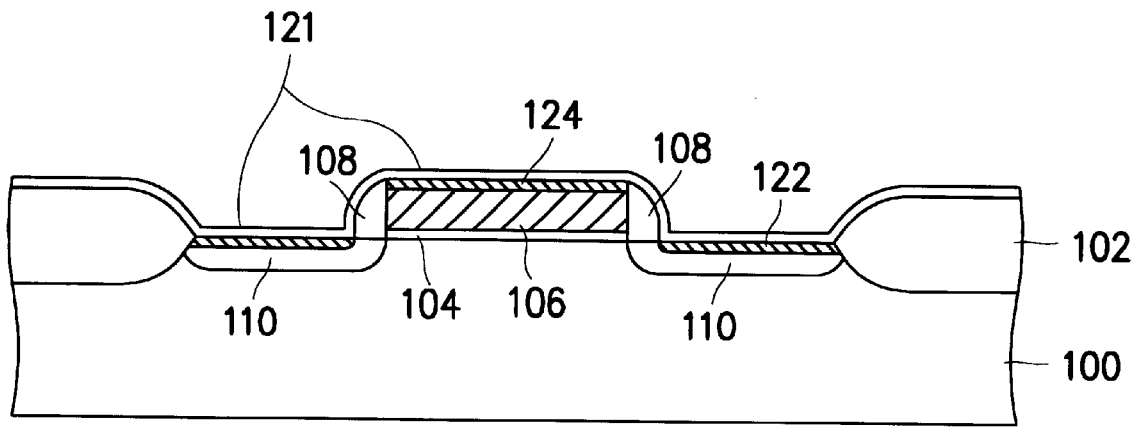
FIG. 12 is a sectional view illustrating a MOS transistor fabrication method to which a cobalt salicide process according to a second embodiment of the present invention is applied.

FIG. 12 is a sectional view illustrating a MOS transistor fabrication method with a second capping layer formed of an insulator, to which a cobalt salicide process according to a second embodiment of the present invention is applied.

Referring to FIG. 12, after a primary heat treatment is performed and unreacted cobalt and first capping layers are removed in the same manner as in the first embodiment of the present invention, a second capping layer 121 is formed of an insulator, preferably, one of an oxide, SiN, and SiON. Then, a secondary heat treatment is performed under the same conditions as in the first embodiment, resulting in reaction between cobalt monosilicide and silicon. Thus, cobalt monosilicide regions are phase-transited to cobalt disilicide regions 122 and 124 having low resistivity. Here, the second capping layer 121 serves to suppress diffusion of cobalt and control a silicidation rate in the secondary heat treatment, as in the first embodiment. While the second capping layer 121 is removed after the secondary heat treatment in the first embodiment, it still remains in the second embodiment.

While the cobalt salicide process has been described in the above embodiments, it is to be appreciated that the present invention can be applied to a salicide process using titanium or nickel instead of cobalt.

Figure 13:
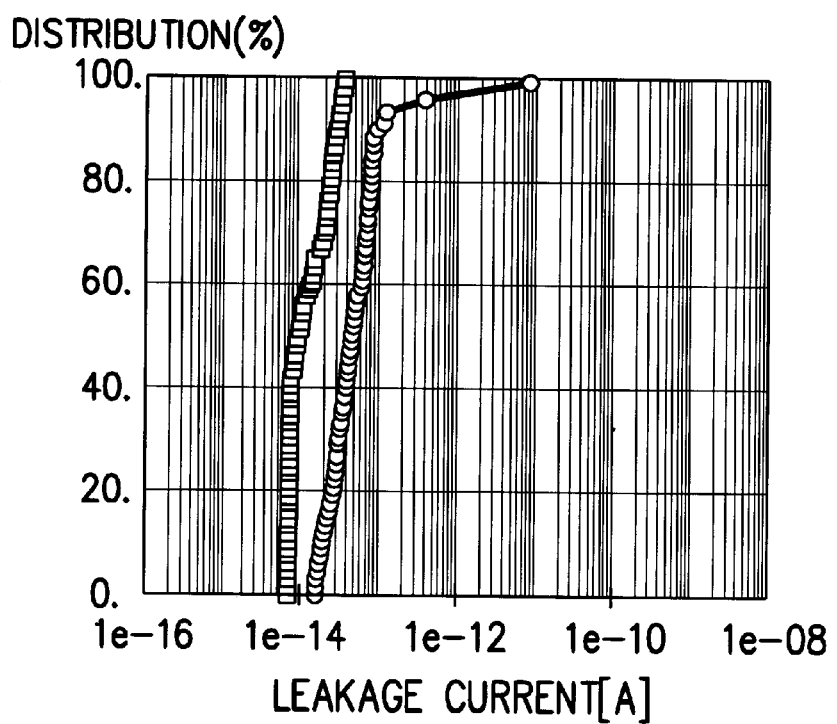
FIG. 13 is a graph comparing the junction leakage characteristics of MOS transistors to which the cobalt salicide processes of the prior art and the present invention are respectively applied.

FIG. 13 is a graph showing the junction leakage characteristics of MOS transistors fabricated by cobalt salicide processes of the prior art and the present invention, for purpose of comparison. In FIG. 13, the symbol "○" represents a junction leakage characteristic in the prior art, and the symbol "□" represents a junction leakage characteristic in the present invention where a second capping layer is formed of an oxide deposited by PECVD (Plasma Enhanced Chemical Vapor Deposition).

Referring to FIG. 13, junction leakage currents are widely distributed from 1e-14[A] to 1e-12[A] in the prior art without a second capping layer, whereas they are almost uniformly at 1e-14[A] in the present invention. That is, the present invention exhibits good leakage characteristics since the second capping layer suppresses the surface diffusion of cobalt in the secondary heat treatment and thus silicide spiking is prevented in the vicinity of the depletion layer of a source/drain region.

Figure 14:
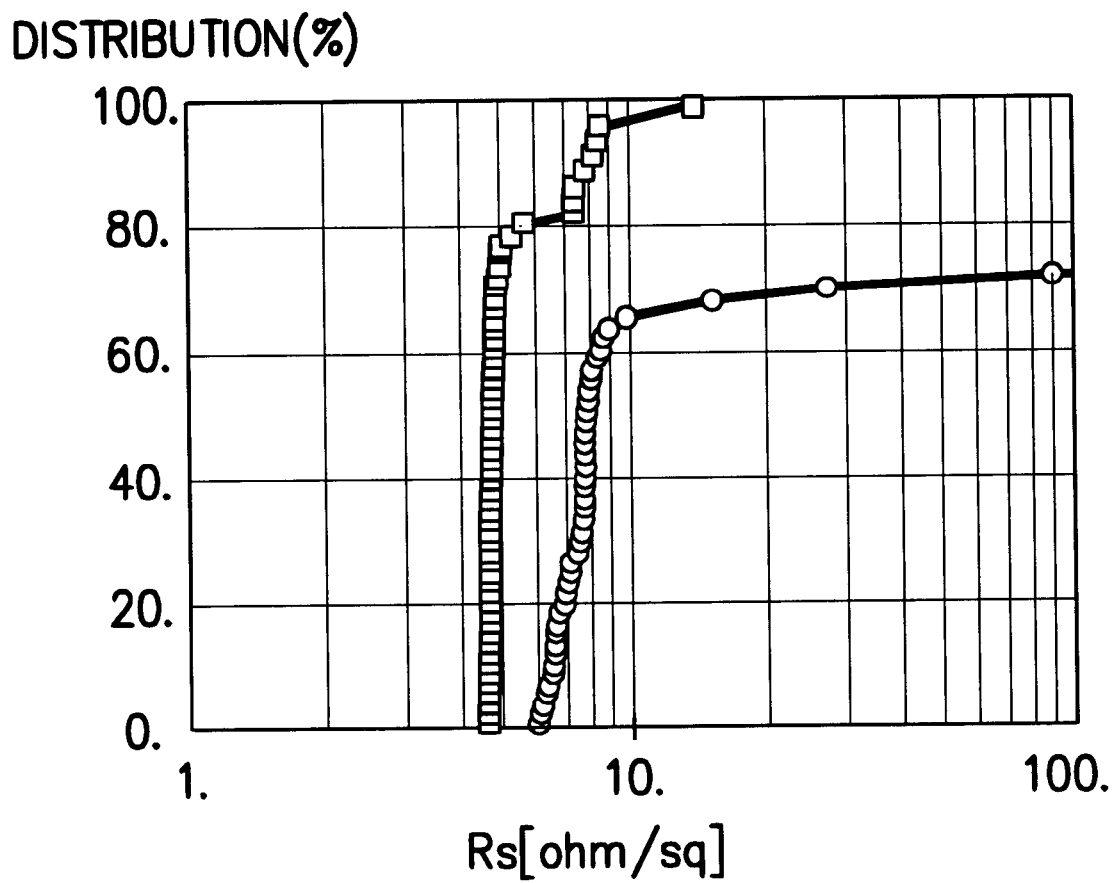
FIG. 14 is a graph comparing the thermal stabilities of cobalt silicides in the MOS transistors to which the cobalt salicide processes of the prior art and the present invention are respectively applied.

FIG. 14 is a graph of measured distributions of sheet resistances (Rs) in source/drain regions in the MOS transistors of the prior art and the present invention after a cobalt salicide process and a heat treatment at 850° C. for 60 minutes in order to demonstrate the thermal stabilities of the respective cobalt silicides. In FIG. 14, the symbol "○" represents the sheet resistance of a source/drain region in the prior art, and the symbol "□" represents the sheet resistance of a source/drain region in the present invention where a second capping layer is formed of titanium nitride.

Referring to FIG. 14, a sheet resistance distribution of the source/drain region in the prior art is wide, ranging from several to several hundreds [ohm/sq], whereas it is almost uniformly at or below 10 [ohm/sq] in the present invention. That is, since the second capping layer suppresses the surface diffusion of cobalt in the secondary heat treatment, the roughness of the silicide-silicon interface is improved and thus the thermal stability of silicide in a subsequent heat treatment can be enhanced in the present invention.

According to the present invention as described above, formation of a second capping layer on the surface of cobalt silicide resulting from a primary heat treatment suppresses a silicidation rate in a secondary heat treatment at high temperature. The resulting improvement in the roughness of the silicide-silicon interface allows a cobalt silicide of a good morphology to be obtained. Therefore, stable junction leakage characteristics can be ensured and the thermal stability of cobalt silicide can be improved.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A semiconductor device fabrication method comprising:

forming a gate layer on a semiconductor substrate and patterning the gate layer to form a first resultant structure;

forming a metal layer on the first resultant structure;

forming a capping layer on the metal layer;

forming a metal silicide on the gate layer by heating the substrate at a first temperature;

removing unreacted metal and first capping layers to form a second resultant structure;

forming a second capping layer on the second resultant structure; and heating the substrate at a second temperature.

2. The semiconductor device fabrication method of claim 1, wherein the second temperature is higher than the first temperature.

3. The semiconductor device fabrication method of claim 1, wherein the metal layer is formed of cobalt.

4. The semiconductor device fabrication method of claim 1, further comprising forming sidewall spacers at both edges of the gate layer, before forming the metal layer.

5. The semiconductor device fabrication method of claim 1, further comprising forming source/drain regions at both sides of the gate layer on the substrate, before forming the metal layer.

6. The semiconductor device fabrication method of claim 5, wherein the metal silicide is formed on the surfaces of the source/drain regions.

7. A semiconductor device fabrication method comprising:

forming a gate layer on a semiconductor substrate and patterning the gate layer to form a first resultant structure;

forming a metal layer on the first resultant structure;

forming a capping layer on the metal layer;

forming a metal silicide on the gate layer by heating the substrate at a first temperature;

removing unreacted metal and first capping layers to form a second resultant structure;

forming a second capping layer of a conductor on the second resultant structure; and heating the substrate at a second temperature.

8. The semiconductor device fabrication method of claim 7, wherein the conductor is one of titanium nitride, titanium tungsten, tantalum nitride, and tungsten nitride.

9. The semiconductor device fabrication method of claim 7, further comprising removing the second capping layer after heating the substrate at the second temperature.

10. A semiconductor device fabrication method comprising:

forming a gate layer on a semiconductor substrate and patterning the gate layer to form a first resultant structure;

forming a metal layer on the first resultant structure;

forming a capping layer on the metal layer;

forming a metal silicide on the gate layer by heating the substrate at a first temperature;

removing unreacted metal and first capping layers to form a second resultant structure;

forming a second capping layer of an insulator on the second resultant stricture; and heating the substrate at a second temperature.

11. The semiconductor device fabrication method of claim 10, wherein the insulator is one of an oxide, SiN, and SiON.

12. The semiconductor device fabrication method of claim 1, wherein the second capping layer is formed to be 10 Å or thicker.

13. The semiconductor device fabrication method of claim 1, wherein a metal monosilicide is formed on the gate layer in the heating of the substrate at the first temperature, and the metal monosilicide is changed to a metal disilicide in the heating of the substrate at the second temperature.

* * * * *

UNITED STATES PATENT AND TRADEMARK OFFICE
CERTIFICATE OF CORRECTION

PATENT NO. : 6,329,276 B1
DATED : December 11, 2001
INVENTOR(S) : Ja-Hum Ku et al.

It is certified that error appears in the above-identified patent and that said Letters Patent is hereby corrected as shown below:

Column 1,
Line 31, after "group-VIII" delete "suicides" and insert therefor -- silicides --
Line 44, after "gate in", delete "a"

Signed and Sealed this

Seventh Day of June, 2005

JON W. DUDAS
*Director of the United States Patent and Trademark Office*